United States Patent
Yokomichi et al.

(10) Patent No.: US 7,721,169 B2
(45) Date of Patent: May 18, 2010

(54) SCAN CIRCUIT AND IMAGE SENSOR HAVING SCAN CIRCUIT

(75) Inventors: Masahiro Yokomichi, Chiba (JP); Satoshi Machida, Chiba (JP); Yoshihiro Shibuya, Chiba (JP); Yukito Kawahara, Chiba (JP); Minoru Ariyama, Chiba (JP)

(73) Assignee: Seiko Instruments Inco. (JP)

( * ) Notice: Subject to any disclaimer, the term of this patent is extended or adjusted under 35 U.S.C. 154(b) by 1697 days.

(21) Appl. No.: 10/367,130

(22) Filed: Feb. 14, 2003

(65) Prior Publication Data

US 2003/0156105 A1 Aug. 21, 2003

(51) Int. Cl.
G01R 31/28 (2006.01)
H04N 1/46 (2006.01)

(52) U.S. Cl. ...................... 714/726; 358/474

(58) Field of Classification Search ........... 714/726, 714/727, 729; 345/204; 358/474, 505, 513; 377/70, 73, 75; 382/312; 715/201
See application file for complete search history.

(56) References Cited

U.S. PATENT DOCUMENTS

| | | | | |
|---|---|---|---|---|
| 5,023,810 A | * | 6/1991 | Briant et al. | 715/203 |
| 5,448,575 A | * | 9/1995 | Hashizume | 714/727 |
| 5,465,053 A | * | 11/1995 | Edwards | 324/770 |
| 5,703,884 A | * | 12/1997 | Ozaki | 714/30 |
| 5,719,879 A | * | 2/1998 | Gillis et al. | 714/726 |
| 5,909,453 A | * | 6/1999 | Kelem et al. | 714/727 |
| 5,925,143 A | * | 7/1999 | Gillis et al. | 714/726 |
| 6,615,380 B1 | * | 9/2003 | Kapur et al. | 714/738 |

OTHER PUBLICATIONS

"Reconfigurable scan chains: A novel approach to reduce test application time" Narayanan et al. Computer-Aided Design, 1993. ICCAD-93. Digest of Technical Papers., 1993 IEEE/ACM International Conference on Publication Date: Nov. 7-11, 1993 On pp. 710-715 ISBN: 0-8186-4490-7 INSPEC Accession No. 4979762.*
"Using a single input to support multiple scan chains" by Kuen-Jong et al. This paper appears in: Computer-Aided Design, 1998. ICCAD 98. Digest of Technical Papers. 1998 IEEE/ACM International Conference on Publication Date: Nov. 8-12, 1998 On pp. 74-78 ISBN: 1-58113-008-2 INSPEC Accession No. 6127634.*
"Optimal configuring of multiple scan chains" by Narayanan et al. This paper appears in: Computers, IEEE Transactions on Publication Date: Sep. 1993 vol. 42, Issue: 9 On pp. 1121-1131 ISSN: 0018-9340 INSPEC Accession No. 4580572.*

* cited by examiner

*Primary Examiner*—Cynthia Britt
(74) *Attorney, Agent, or Firm*—Adams & Wilks

(57) ABSTRACT

A scanning circuit has path switches connected between a plurality of data flip-flop circuits of the scanning circuit for sequentially reading an output signal in synchronism with a clock. A plurality of control signal lines select the path switches to arbitrarily skip reading of the flip-flop circuits that do not require the scanning circuit and always fix a potential of the skipped data flip-flop circuit. Only the arbitrary data is read, and in the case where unnecessary data exists, reading is skipped, to thereby increase the read rate.

20 Claims, 16 Drawing Sheets

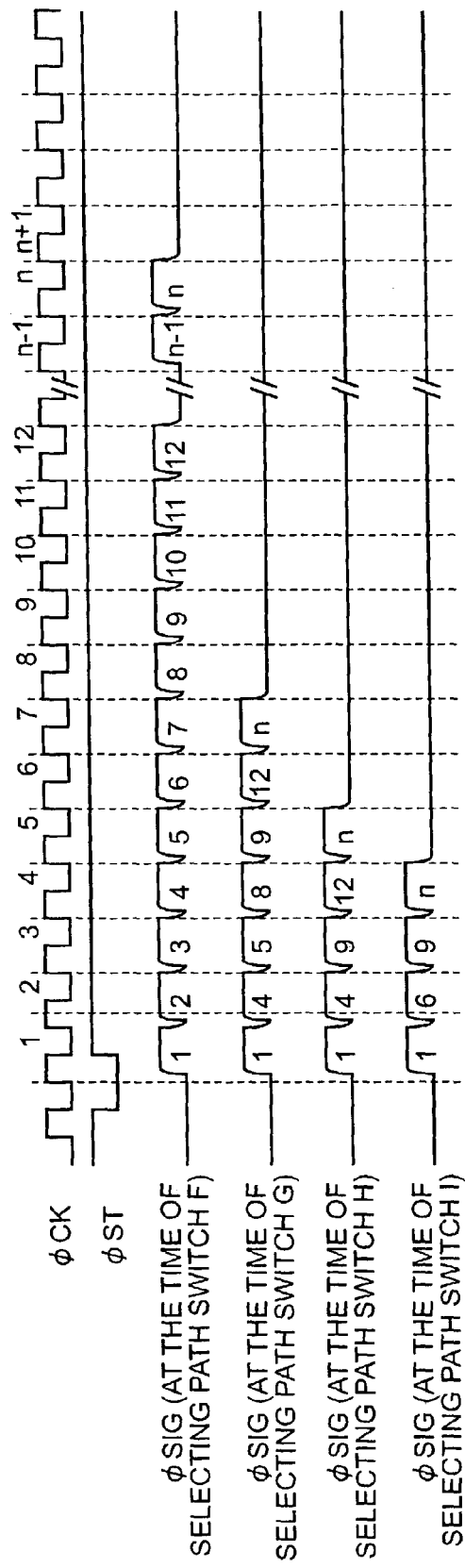

FIG. 10

| PATH SWITCH | SW 1-1 | SW 1-2 | SW 1-3 | SW 1-4 | SW 1-5 | SW 1-6 | SW 1-7 | SW 1-8 | SW 1-9 | SW 1-10 | SW 1-11 | SW 1-12 |
|---|---|---|---|---|---|---|---|---|---|---|---|---|
| SWITCH SETTING OF PATH SWITCH CIRCUIT ARRAY F | ON | ON | ON | ON | ON | ON | ON | ON | ON | ON | ON | ON |

<div style="text-align:right">AT THE TIME OF SELECTING PATH SWITCH F</div>

| PATH SWITCH | SW 2-1 | SW 2-2 | SW 2-3 | SW 2-4 | SW 2-5 | SW 2-6 | SW 3-1 | SW 3-2 | SW 3-3 | SW 3-4 | SW 4-1 | SW 4-2 | SW 4-3 |
|---|---|---|---|---|---|---|---|---|---|---|---|---|---|
| SWITCH SETTING OF PATH SWITCH CIRCUIT ARRAYS G, H AND I | OFF | OFF | OFF | OFF | OFF | OFF | OFF | OFF | OFF | OFF | OFF | OFF | OFF |

| RESET CIRCUIT | R1 | R2 | R3 | R4 | R5 | R6 | R7 | R8 | R9 | R10 | R11 | R12 | Rn |
|---|---|---|---|---|---|---|---|---|---|---|---|---|---|
| LOGICAL SETTING OF RESET CIRCUIT ARRAY F | L | L | L | L | L | L | L | L | L | L | L | L | L |

FIG. 11

| PATH SWITCH | SW 1-1 | SW 1-2 | SW 1-3 | SW 1-4 | SW 1-5 | SW 1-6 | SW 1-7 | SW 1-8 | SW 1-9 | SW 1-10 | SW 1-11 | SW 1-12 |
|---|---|---|---|---|---|---|---|---|---|---|---|---|
| SWITCH SETTING OF PATH SWITCH CIRCUIT ARRAY F | OFF | OFF | OFF | OFF | OFF | OFF | OFF | OFF | OFF | OFF | OFF | OFF |

| PATH SWITCH | SW 2-1 | SW 2-2 | SW 2-3 | SW 2-4 | SW 2-5 | SW 2-6 | SW 3-1 | SW 3-2 | SW 3-3 | SW 3-4 | SW 4-1 | SW 4-2 | SW 4-3 |
|---|---|---|---|---|---|---|---|---|---|---|---|---|---|
| SWITCH SETTING OF PATH SWITCH CIRCUIT ARRAYS G, H AND I | ON | ON | ON | ON | ON | ON | OFF | OFF | OFF | OFF | OFF | OFF | OFF |

AT THE TIME OF SELECTING PATH SWITCH G

| RESET CIRCUIT | R1 | R2 | R3 | R4 | R5 | R6 | R7 | R8 | R9 | R10 | R11 | R12 | Rn |
|---|---|---|---|---|---|---|---|---|---|---|---|---|---|
| LOGICAL SETTING OF RESET CIRCUIT ARRAY F | L | H | H | L | L | H | H | L | L | H | H | L | L |

SCAN CIRCUIT AND IMAGE SENSOR HAVING SCAN CIRCUIT

BACKGROUND OF THE INVENTION

1. Field of the Invention

The present invention is directed to a scan circuit (hereinafter "scanning circuit") that is adaptive to plural kinds of systems different in scanning order by arbitrarily skipping reading of a plurality of data flip flop circuits that do not require the scanning circuit when a coarse system of a scanning means is selected in the scanning circuit which is made up of the plurality of data flip flop circuits that sequentially read an output signal in synchronism with a clock.

2. Description of the Related Art

A conventional scanning circuit that is made up of a plurality of data flip flop circuits that sequentially read an output signal in synchronism with a clock is used as a drive circuit for a sensor IC or a memory. In the case where only arbitrary bit data is intended to be read, it is necessary to sample only data necessary for the external after all of data has been read once (for example, refer to JP 5-167988 A (pp. 7-8, FIG. 9).

Since the conventional scanning circuit is structured as described above, a read rate at the time of reading all of data is fixed because all of data is read. Also, the coarse system of the scanning means cannot be selected, and an external processing IC is required.

SUMMARY OF THE INVENTION

Under the above circumstances, in order to solve the above-mentioned problem, according to the present invention, there is provided a scanning circuit in which path switches are connected between a plurality of data flip circuits of the scanning circuit that sequentially reads an output signal in synchronism with a clock, a plurality of control signal lines that select the scanning means are provided, and a means is provided, by which in not only the usual scanning circuit that sequentially reads all of the plurality of data flip circuits but also the scanning circuit when the coarse system of the scanning means is selected, by controlling the path switches, it is possible to arbitrarily skip reading of the flip flop circuits that do not require the scanning circuit and always fix a potential of the skipped data flip circuit. Only the arbitrary data is read by the above means, and in the case where unnecessary data exists, reading is skipped, to thereby make the read rate high.

BRIEF DESCRIPTION OF THE DRAWINGS

These and other objects and advantages of this invention will become more fully apparent from the following detailed description taken with the accompanying drawings in which:

FIG. 8 is a timing chart of the sensor IC using the scanning circuit in accordance with the embodiment of the present invention;

FIG. 10 is the switch setting of the path switches F, G, H and I at the time of selecting the path switch F in FIG. 1;

FIG. 11 is the switch setting of the path switches F, G, H and I at the time of selecting the path switch G in FIG. 1;

DESCRIPTION OF THE PREFERRED EMBODIMENTS

Now, a description will be given in more detail of preferred embodiments of the present invention with reference to the accompanying drawings.

Figure 1A:
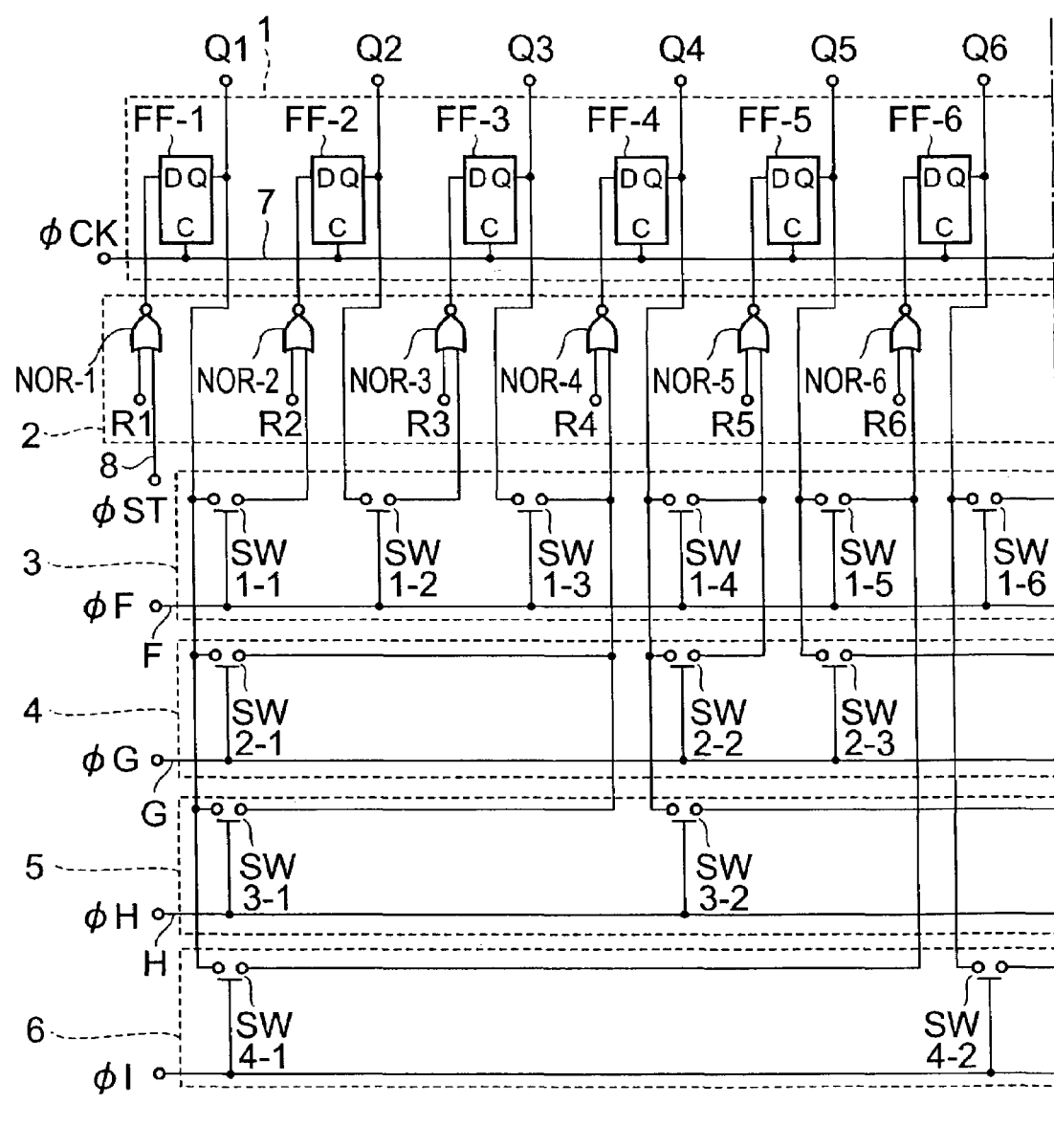
FIGS. 1A-1B (hereinafter "FIG. 1") show a circuit diagram of a scanning circuit in accordance with an embodiment of the present invention.
Figure 1B:
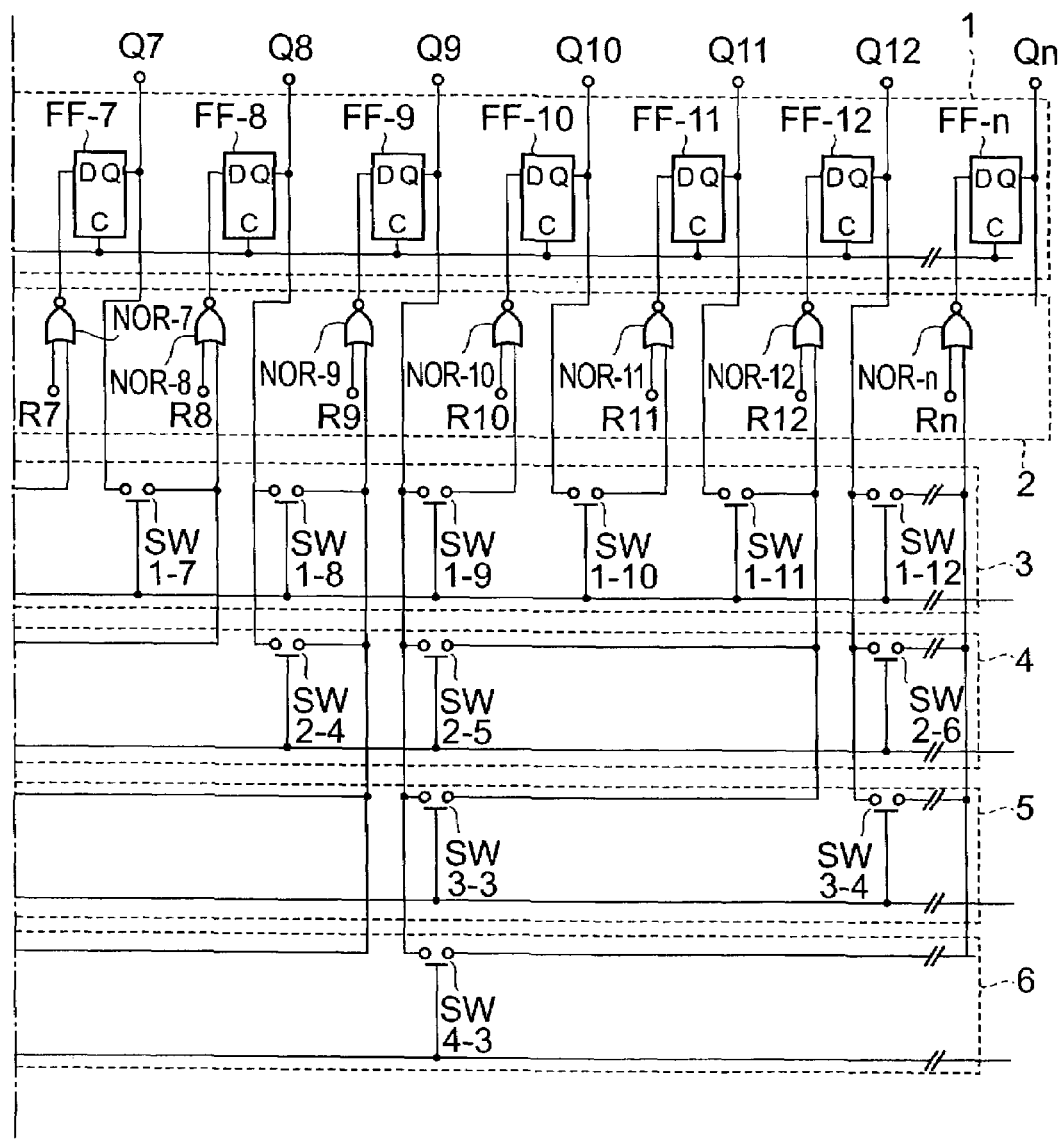
Figure 2:
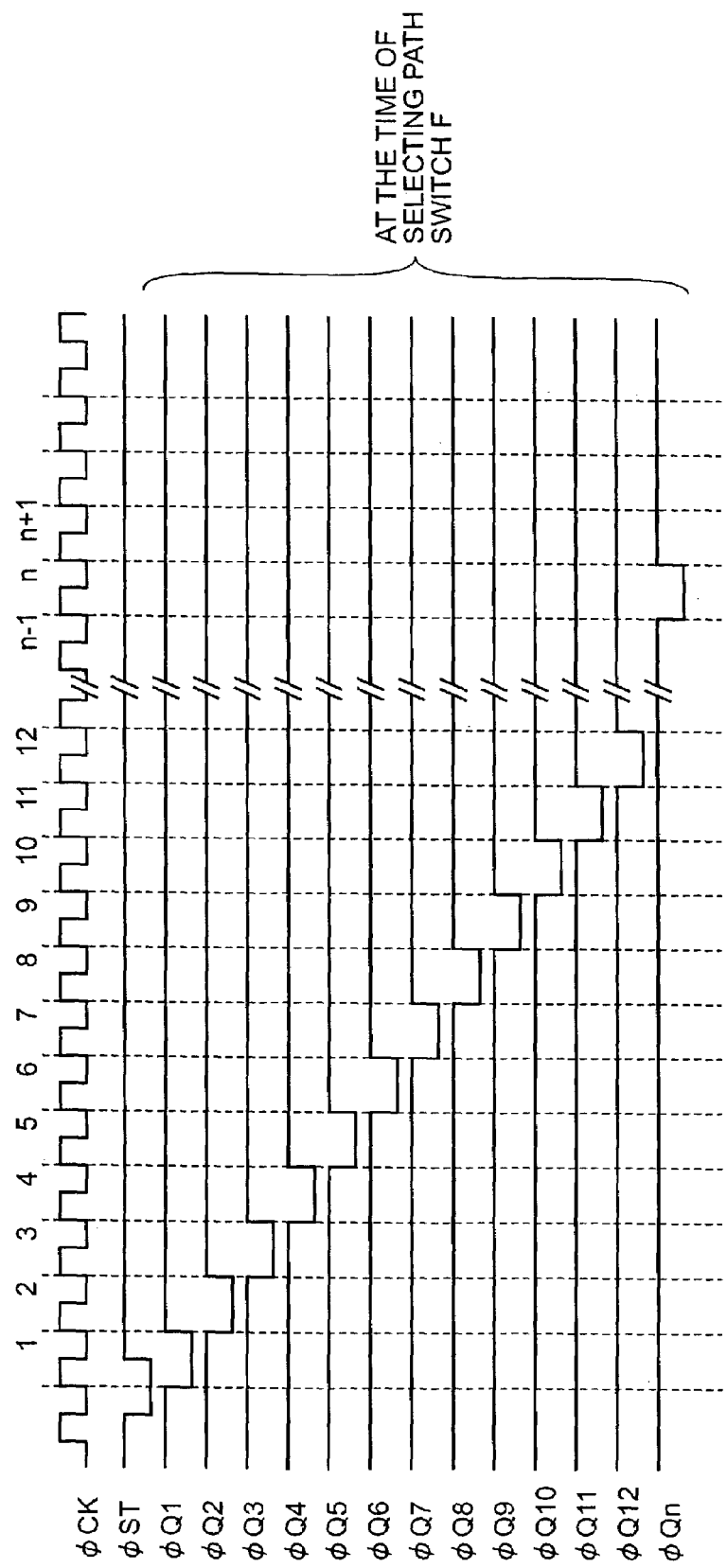
FIG. 2 is a timing chart at the time of selecting a path switch F in setting of FIG. 10 in FIG. 1.
Figure 3:
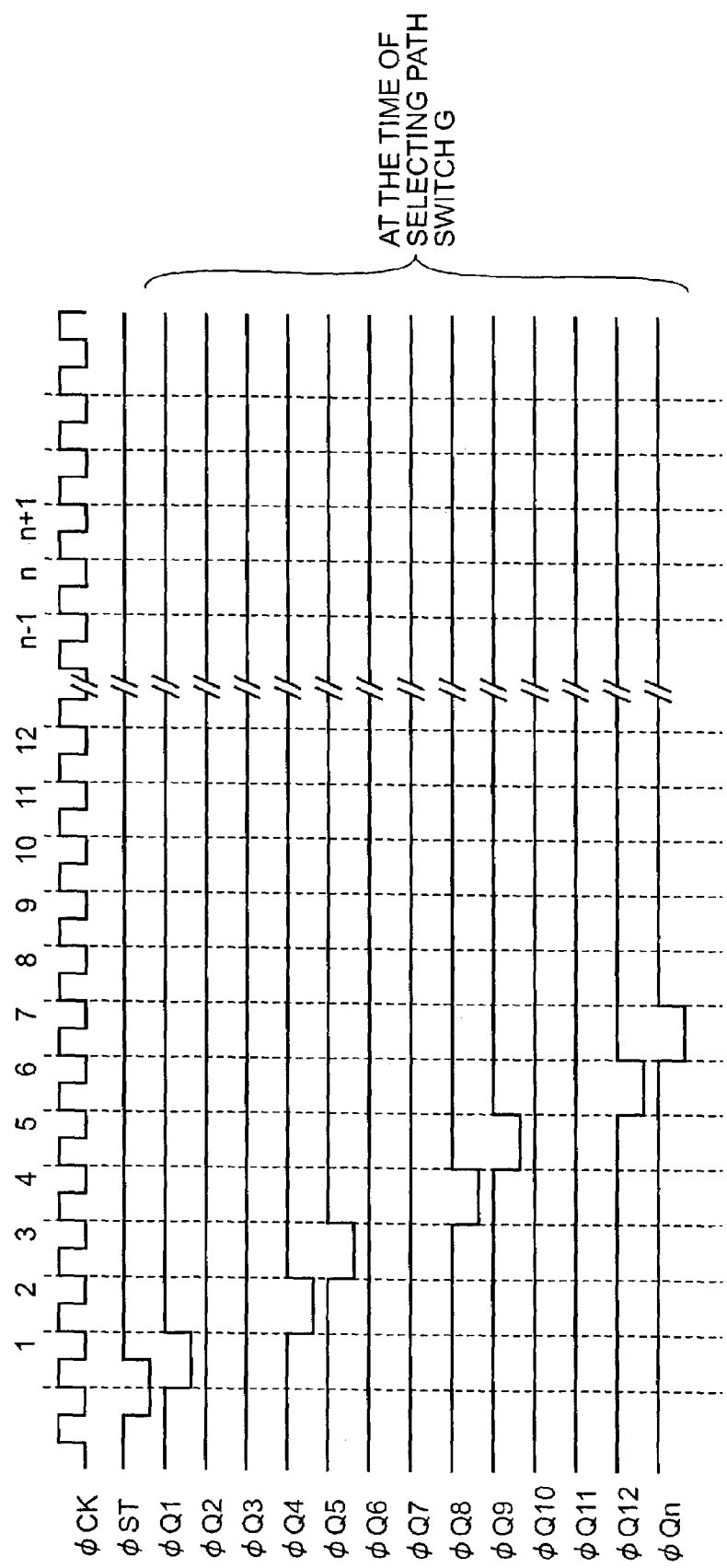
FIG. 3 is a timing chart at the time of selecting a path switch G in setting of FIG. 11 in FIG. 1.
Figure 4:
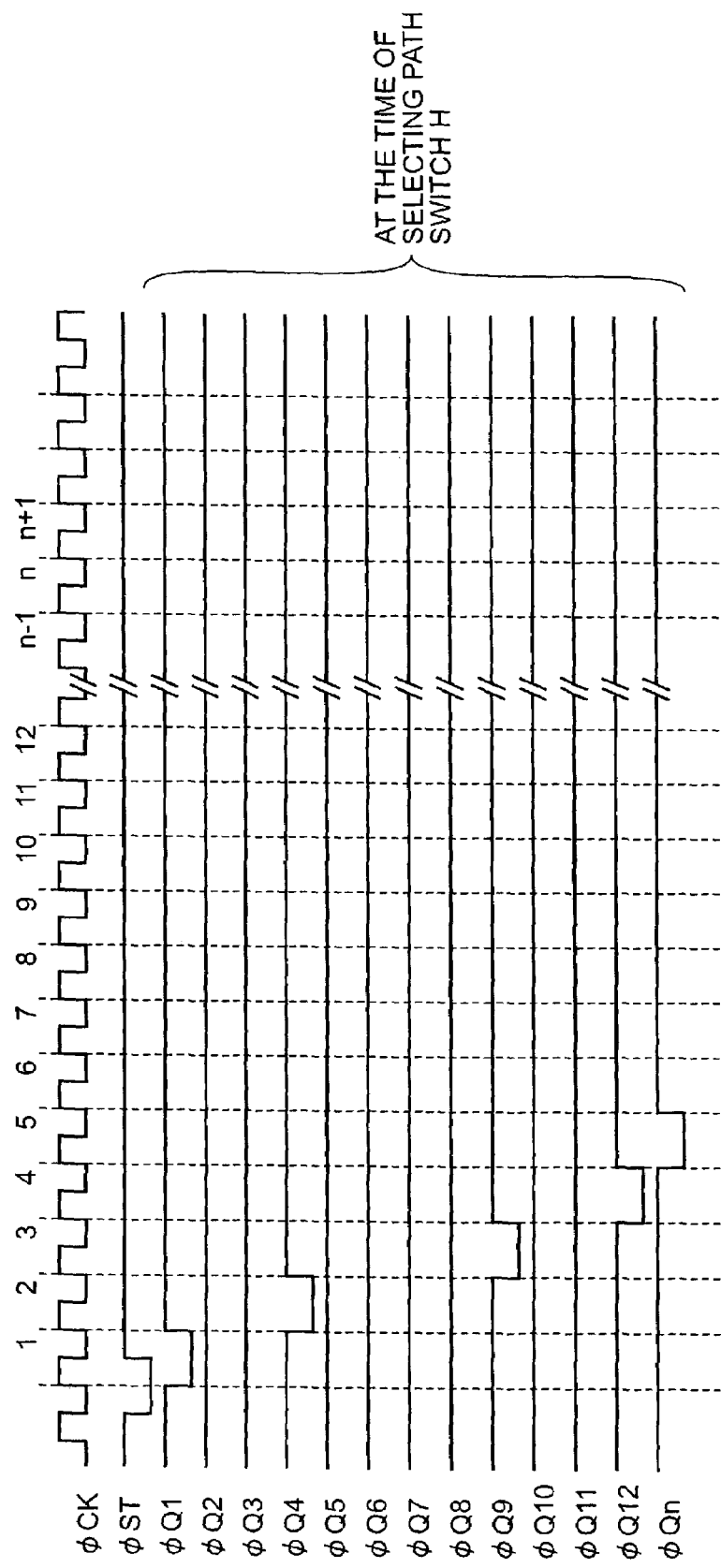
FIG. 4 is a timing chart at the time of selecting a path switch H in setting of FIG. 12 in FIG. 1.
Figure 5:
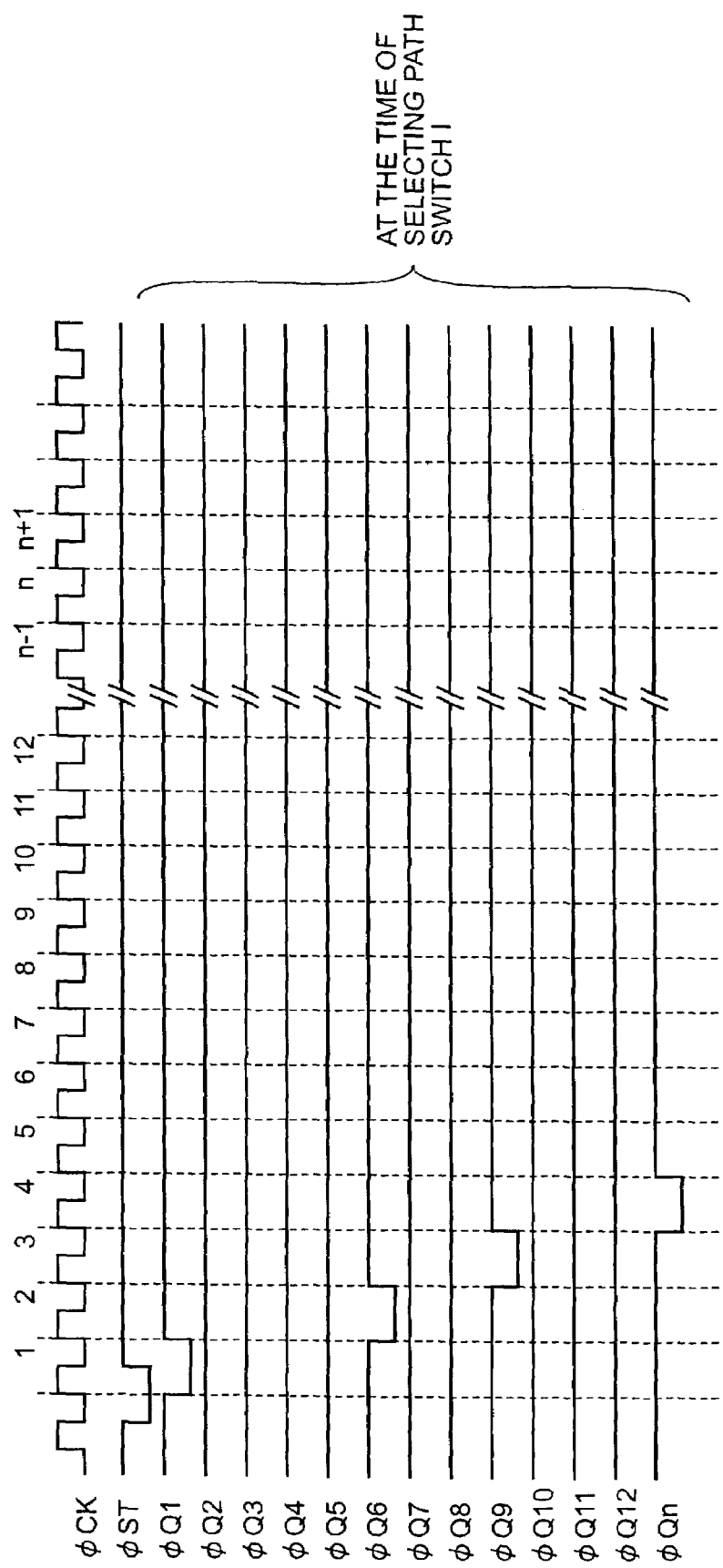
FIG. 5 is a timing chart at the time of selecting a path switch I in setting of FIG. 13 in FIG. 1.

FIGS. 1A to 1B show a circuit diagram of a scanning circuit in accordance with a first embodiment of the present invention, FIG. 2 is a timing chart at the time of selecting a path switch F in FIG. 1, FIG. 3 is a timing chart at the time of selecting a path switch G in FIG. 1, FIG. 4 is a timing chart at the time of selecting a path switch H in FIG. 1, and FIG. 5 is a timing chart at the time of selecting a path switch I in FIG. 1.

FIG. 10 shows the switch setting of the path switches F, G, H and I at the time of selecting the path switch F in FIG. 1 and the logical setting of input terminals R1, R2, R3 . . . Rn of a reset circuit array 2.

FIG. 11 shows the switch setting of the path switches F, G, H and I at the time of selecting the path switch G in FIG. 1 and the logical setting of input terminals R1, R2, R3 . . . Rn of a reset circuit array 2.

Figure 12:
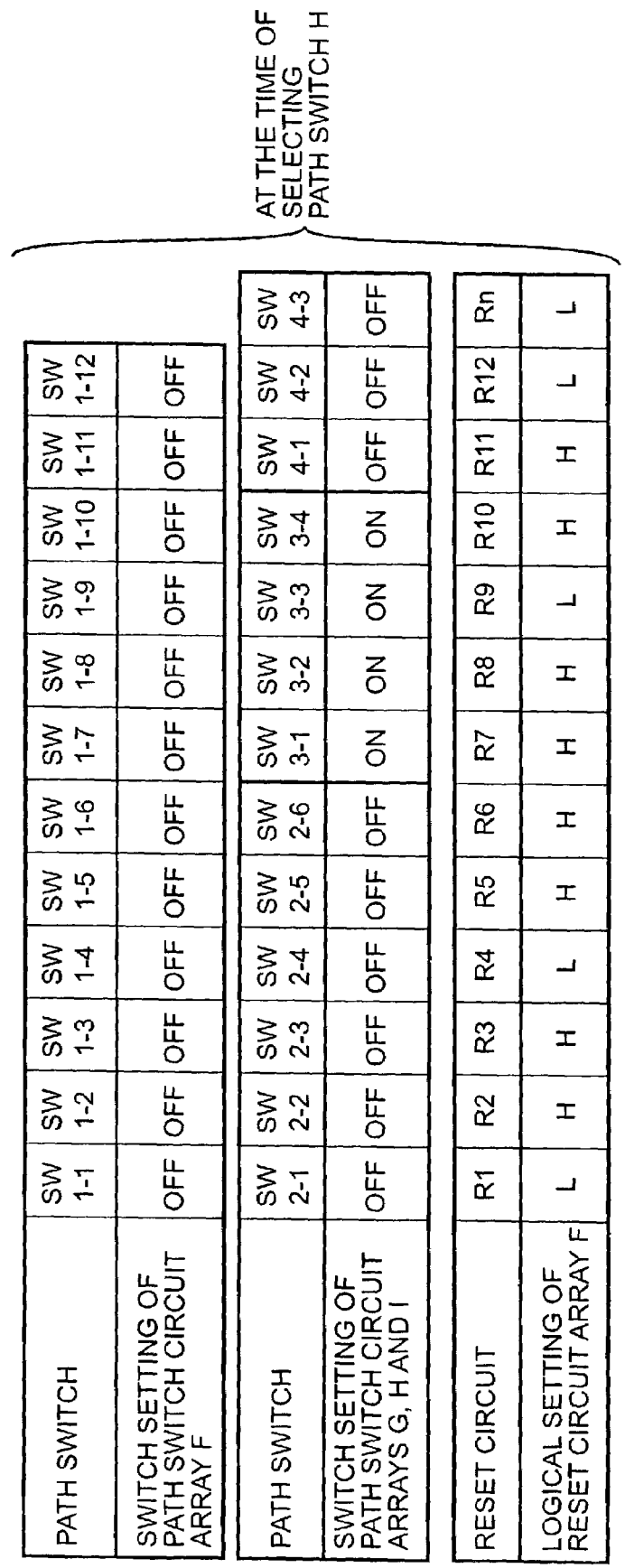
FIG. 12 is the switch setting of the path switches F, G, H and I at the time of selecting the path switch H in FIG. 1.

FIG. 12 shows the switch setting of the path switches F, G, H and I at the time of selecting the path switch H in FIG. 1 and the logical setting of input terminals R1, R2, R3 . . . Rn of a reset circuit array 2.

Figure 13:
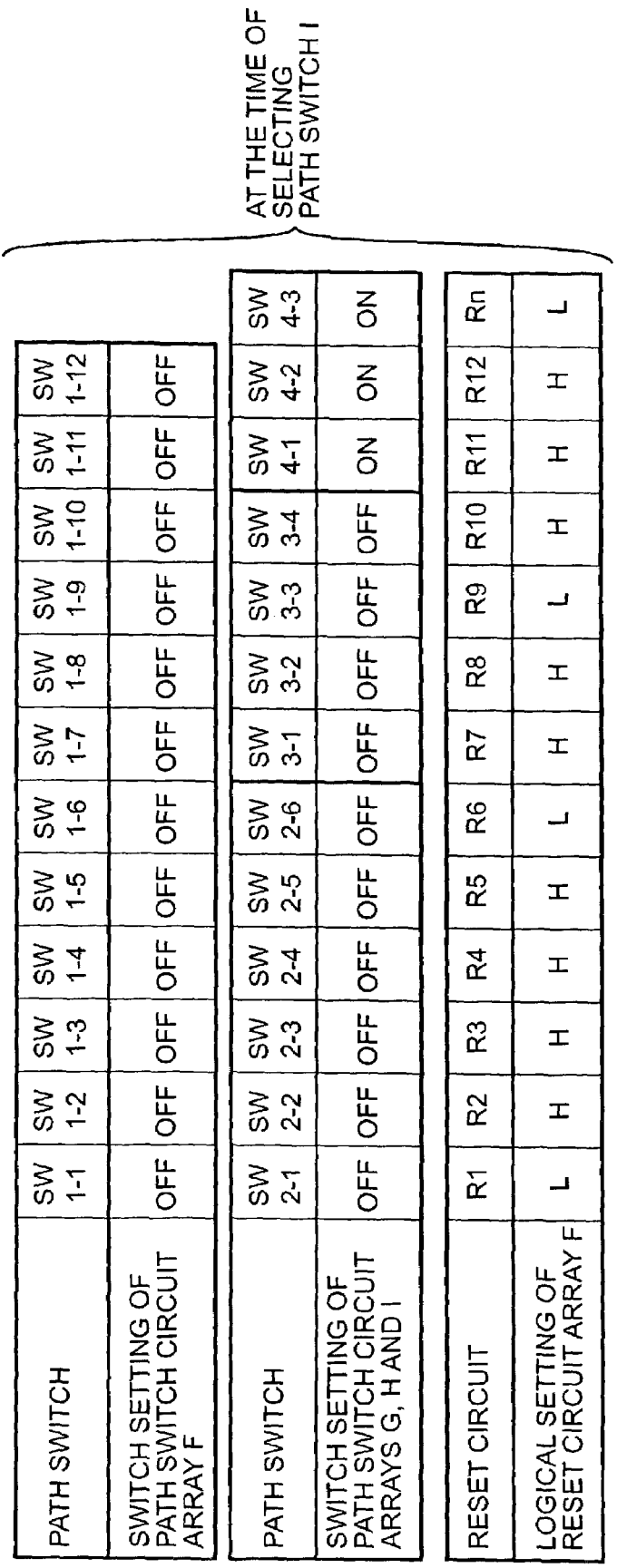
FIG. 13 is the switch setting of the path switches F, G, H and I at the time of selecting the path switch I in FIG. 1.

FIG. 13 shows the switch setting of the path switches F, G, H and I at the time of selecting the path switch I in FIG. 1 and the logical setting of input terminals R1, R2, R3 . . . Rn of a reset circuit array 2.

Referring to FIG. 1, the scanning circuit is made up of a data flip flop circuit array 1, a reset circuit array 2 of the data flip flop circuit, a path switch circuit array 3 at the time of selecting the path switch F, a path switch circuit array 4 at the time of selecting the path switch G, a path switch circuit array 5 at the time of selecting the path switch H, and a path switch circuit array 6 at the time of selecting the path switch I.

In the data flip flop circuit array 1, n data flip circuits FF-1, FF-2, FF-3, FF-4, FF-5, FF-6, FF-7, FF-8, FF-9, FF-10, FF-11, FF-12, . . . FF-n that sequentially transfer data to a post-stage in synchronism with a clock signal ΦCK are arranged and commonly connected with a clock 7 (ΦCK) that drives the data flip circuit, and the data flip circuit FF-1 is connected with a start pulse 8 (ΦST). In the reset circuit array 2 of the data flip flop, the outputs of n NOR circuits NOR-1, NOR-2, NOR-3, NOR-4, NOR-5, NOR-6, NOR-7, NOR-8, NOR-9, NOR-10, NOR-11, NOR-12, and NOR-n are connected to the data input terminals of the respective data flip flop circuits, and, ones of the input terminals are connected with corresponding reset signal terminals R1, R2, R3, R4, R5, R6, R7, R8, R9, R10, R11, R12 and Rn.

In this embodiment, the reset circuit array in the case where the data flip flop is configured as being LOW active is structured by NOR circuits, but in case of HIGH active, an NAND circuit may be applied.

In the path switch circuit array 3 at the time of selecting the path switch F, a control signal line F that changes over the read order of the scanning circuit is commonly connected to the control terminals of path switches SW1-1, SW1-2, SW1-3, SW1-4, SW1-5, SW1-6, SW1-7, SW1-8, SW1-9, SW1-10, SW1-11, and SW1-12 between the data flip flop circuits. The path switch SW1-1 is connected between the output Q1 of FF-1 and the input terminal of NOR-2, the path switch SW1-2 is connected between the output Q1 of FF-2 and the input terminal of NOR-3, and the path switch SW1-3 is connected between the output Q1 of FF-3 and the input terminal of NOR-4. In addition, the path switch SW1-4 is connected between the output Q1 of FF-4 and the input terminal of NOR-5, the path switch SW1-5 is connected between the output Q1 of FF-5 and the input terminal of NOR-6, and the path switch SW1-6 is connected between the output Q1 of FF-6 and the input terminal of NOR-7. In addition, the path switch SW1-7 is connected between the output Q1 of FF-7 and the input terminal of NOR-8, the path switch SW1-8 is connected between the output Q1 of FF-8 and the input terminal of NOR-9, the path switch SW1-9 is connected between the output Q1 of FF-9 and the input terminal of NOR-10, and the path switch SW1-10 is connected between the output Q1 of FF-10 and the input terminal of NOR-11. In addition, the path switch SW1-11 is connected between the output Q1 of FF-11 and the input terminal of NOR-12, and the path switch SW1-12 is connected between the output Q1 of FF-12 and the input terminal of NOR-13.

In the path switch circuit array 4 at the time of selecting the path switch G, a control signal line G that changes over the read order of the scanning circuit is commonly connected to the control terminals of path switches SW2-1, SW2-2, SW2-3, SW2-4, SW2-5, and SW2-6 between the data flip flop circuits. The path switch SW2-1 is connected between the output Q1 of FF-1 and the input terminal of NOR-4, the path switch SW2-2 is connected between the output Q4 of FF-4 and the input terminal of NOR-5, the path switch SW2-3 is connected between the output Q5 of FF-3 and the input terminal of NOR-8, and the path switch SW2-4 is connected between the output Q8 of FF-8 and the input terminal of NOR-9. In addition, the path switch SW2-5 is connected between the output Q9 of FF-9 and the input terminal of NOR-6, and the path switch SW2-6 is connected between the output Q12 of FF-12 and the input terminal of NOR-n.

In the path switch circuit array 5 at the time of selecting the path switch H, a control signal line H that changes over the read order of the scanning circuit is commonly connected to the control terminals of path switches SW3-1, SW3-2, SW3-3, and SW3-4 between the data flip flop circuits. The path switch SW3-1 is connected between the output Q1 of FF-1 and the input terminal of NOR-4, the path switch SW3-2 is connected between the output Q4 of FF-4 and the input terminal of NOR-9, the path switch SW3-3 is connected between the output Q9 of FF-9 and the input terminal of NOR-12, and the path switch SW3-4 is connected between the output Q12 of FF-12 and the input terminal of NOR-n.

In the path switch circuit array 6 at the time of selecting the path switch I, a control signal line I that changes over the read order of the scanning circuit is commonly connected to the control terminals of path switches SW4-1, SW4-2, and SW4-3 between the data flip flop circuits.

The path switch SW4-1 is connected between the output Q1 of FF-1 and the input terminal of NOR-6, the path switch SW4-2 is connected between the output Q4 of FF-6 and the input terminal of NOR-9, and the path switch SW4-3 is connected between the output Q9 of FF-9 and the input terminal of NOR-n. Subsequently, the changeover means of the scanning system will be described. In FIG. 10, in the switch setting and the reset circuit array setting at the time of selecting the path switch F, all of the path switches SW1-1, 2, 3, . . . 12 are brought in an ON state, the path switches SW2-1, 2, 3, . . . 6, the path switches SW3-1, 2, 3, and 4 and the path switches SW4-1, 2, and 3 are brought in an OFF state, and all of the logical setting R1, 2, 3, . . . n of one input terminals of NOR-1, 2, 3, . . . n of the reset circuit array 2 become in an L level. With the above setting, all of the data flip flop circuits are scanned. In the timing chart at the time of selecting the path switch F in FIG. 2, when the start pulse ΦST is inputted, all of the data flip circuits FF-1, 2, 3, . . . n of the scanning circuit array 1 sequentially transfer data of Q1, 2, 3, . . . n till n-th data in synchronism with the clock signal ΦCK assuming that the position of the start pulse ΦST is $0^{th}$ data of the clock ΦCK.

In FIG. 11, in the switch setting and the reset circuit array setting at the time of selecting the path switch G, all of the path switches SW1-1, 2, 3, . . . 12 are brought in an OFF state, the path switches SW2-1, 2, 3, 4, 5, and 6 are brought in an ON state, the path switches SW3-1, 2, 3, and 4 and the path switches SW4-1, 2, and 3 are brought in an OFF state, the logical settings R1, R4, R5, R8, R9, R12 and Rn of one input terminals of the NOR-1, 2, 3, . . . n of the reset circuit array 2 are brought in an L level state, and R2, R3, R6, R7, R10 and R11 are set to an H level. With the above setting, an arbitrary data flip flop circuit is scanned.

In the timing chart at the time of selecting the path switch G in FIG. 3, when the start pulse ΦST is inputted, the data flip circuits FF-1, 4, 5, 8, 9, 11, 12, and n of the scanning circuit array 1 sequentially transfer data of Q1, Q4, Q5, Q8, Q9, Q11, Q12 and Qn till seventh data in synchronism with the clock signal ΦCK assuming that the position of the start pulse ΦST is $0^{th}$ data of the clock ΦCK. The potentials of the data of Q2, Q3, Q6, Q7 and Q10 are fixed to the H-level state, and FF-2, FF-3, FF-6, FF-7 and FF-10 are skipped in reading.

In FIG. 12, in the switch setting and the reset circuit array setting at the time of selecting the path switch H, all of the path switches SW1-1, 2, 3, . . . 12 and the path switches SW2-1, 2, 3, 4, 5, and 6 are brought in an OFF-state, the path switches SW3-1, 2, 3, and 4 are brought in an ON state, the path switches SW4-1, 2, and 3 are brought in an OFF state, the logical settings R1, R4, R9, R12 and Rn of one input terminals of the NOR-1, 2, 3, . . . n of the reset circuit array 2 are brought in an L level state, and R2, R3, R5, R6, R7, R8, R10 and R11 are set to an H level. With the above setting, an arbitrary data flip flop circuit is scanned.

In the timing chart at the time of selecting the path switch H in FIG. 4, when the start pulse ΦST is inputted, the data flip circuits FF-1, 4, 9, 12, and n of the scanning circuit array 1 sequentially transfer data of Q1, Q4, Q5, Q9, Q12 and Qn till the fifth data in synchronism with the clock signal ΦCK assuming that the position of the start pulse ΦST is $0^{th}$ data of the clock ΦCK. The potentials of the data of Q2, Q3, Q5, Q6, Q7, Q8, Q10, and Q11 are fixed to the H-level state, and FF-2, FF-3, FF-5, FF-6, FF-7, FF-8, FF-10, and FF-11 are skipped in reading.

In FIG. 13, in the switch setting and the reset circuit array setting at the time of selecting the path switch I, all of the path switches SW1-1, 2, 3, .12, the path switches SW2-1, 2, 3, 4, 5, and 6, and the path switches SW3-1, 2, 3, and 4 are brought in an OFF-state, the path switches SW4-1, 2, and 3 are brought in an ON state, the logical settings R1, R6, R9 and Rn of one input terminals of the NOR-1, 2, 3, . . . n of the reset circuit array 2 are brought in an L level state, and R2, R3, R4, R5, R7, R8, R10, R11, and R12 are set to an H level. With the above setting, an arbitrary data flip flop circuit is scanned.

In the timing chart at the time of selecting the path switch I in FIG. 5, when the start pulse ΦST is inputted, the data flip circuits FF-1, 6, 9, and n of the scanning circuit array 1 sequentially transfer data of Q1, Q6, Q9, and Qn till the fourth data in synchronism with the clock signal ΦCK assuming that the position of the start pulse ΦST is $0^{th}$ data of the clock ΦCK. The potentials of the data of Q2, Q3, Q4, Q5, Q7, Q8, Q10, Q11 and Q12 are fixed to the H-level state, and FF-2, FF-3, FF-4, FF-5, FF-7, FF-8, FF-10, FF-11, and FF-12 are skipped in reading.

As described above, the normal scanning circuit that scans all of the data flip circuits and sequentially reads the data and the scanning circuit that scans only the arbitrary data flip circuit and skips reading of data can be selected by selecting the mode in a multiple manner. Also, there is provided the scanning circuit that is capable of making the scanning rate high while the amount of information is suppressed to the minimum.

In this embodiment, for convenience, a structure is made in such a manner that four kinds of scanning systems are obtained at the time of selecting the path switch F, at the time of selecting the path switch G, at the time of selecting the path switch H and at the time of selecting the path switch I by changing over the MODE signal. However, there is no problem even in the case where if multiple other path switch circuit arrays of m arrays are prepared, m kinds of scanning systems are obtained. Also, the arrangement of the path switches can be changed anywhere on the circuit as long as they are arranged within the path switch circuit array and it is possible to conduct the logical setting of the reset of the reset circuit array in accordance with the circuit, and the order of the skipped data flip circuit may be changed.

Figure 6:
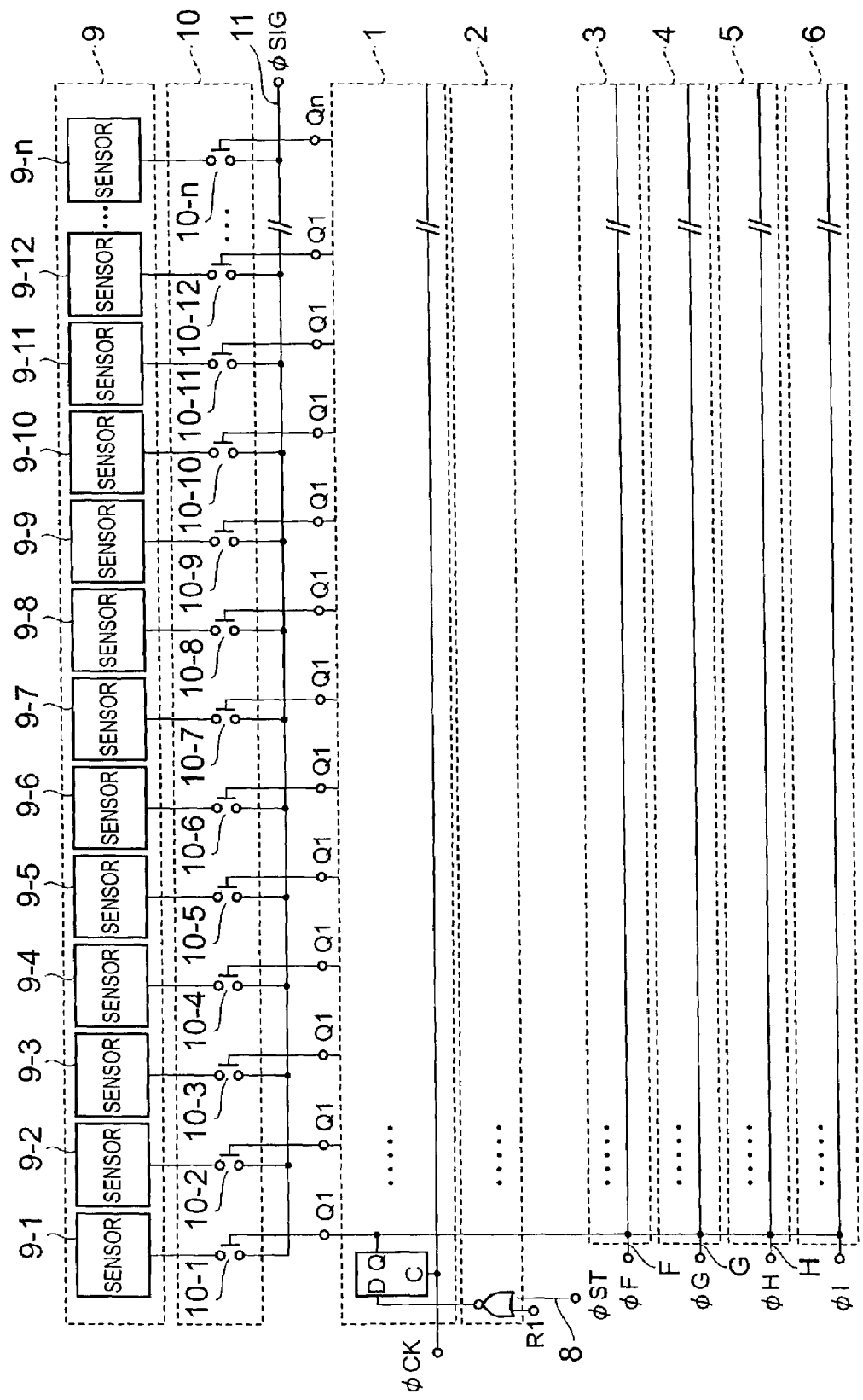
FIG. 6 is a circuit block diagram of a sensor IC using a scanning circuit in accordance with the embodiment of the present invention.
Figure 7:
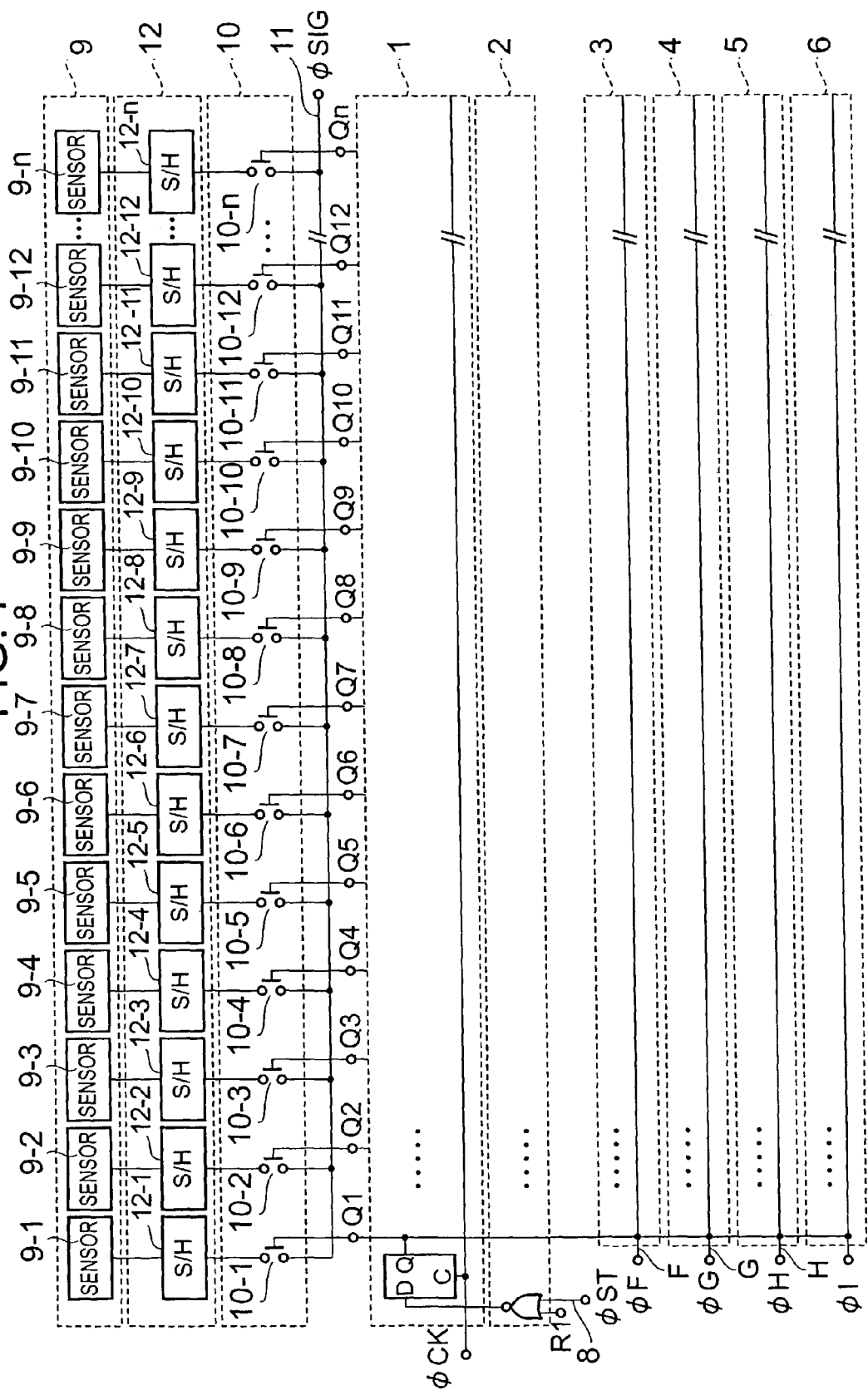
FIG. 7 is a circuit block diagram of the sensor IC including a sample/hold circuit using the scanning circuit therein in accordance with the embodiment of the present invention.

A second embodiment of the present invention will be described with reference to the accompanying drawings. FIG. 6 is a circuit block diagram of a sensor IC using the scanning circuit in accordance with this embodiment. FIG. 7 is a circuit block diagram of a sensor IC in which a sample/hold circuit using the scanning circuit of this embodiment is included. FIG. 8 is a timing chart of the sensor IC using the scanning circuit in accordance with this embodiment.

In this embodiment, a sensor element and a read switch are added to the above-mentioned structure of the first embodiment. In FIG. 6, the scanning circuit includes a data flip flop circuit array 1, a data flip flop reset circuit array 2, a path switch circuit array 3 at the time of selecting the path switch F, a path switch circuit array 4 at the time of selecting the path switch G, a path switch circuit array 5 at the time of selecting the path switch H, and a path switch circuit array 6 at the time of selecting the path switch I, and is connected with a sensor element array 9 and a read switch circuit array 10. It is assumed that the sensor element array 9 is made up of the respective sensor elements 9-1, 9-2, 9-3, . . . , 9-n, and the corresponding read switch circuit array 10 is made up of the read switches 10-1, 10-2, 10-3, . . . , 10-n, respectively.

The common signal line 11 is connected to the terminals of the read switches 10-1, 10-2, 10-3, . . . , 10-n, respectively, and read to a terminal SIG.

In FIG. 7, the scanning circuit includes a data flip flop circuit array 1, a data flip flop reset circuit array 2, a path switch circuit array 3 at the time of selecting the path switch F, a path switch circuit array 4 at the time of selecting the path switch G, a path switch circuit array 5 at the time of selecting the path switch H, and a path switch circuit array 6 at the time of selecting the path switch I, and is connected with a sensor element array 9, a sample/hold circuit array 12, and a read switch circuit array 10. It is assumed that the sensor element array 9 is made up of the respective sensor elements 9-1, 9-2, 9-3, . . . , 9-n, the corresponding sample/hold circuit array 12 is made up of the sample/hold circuits 12-1, 12-2, 12-3, . . . , 12-n, and the corresponding read switch circuit array 10 is made up of the read switches 10-1, 10-2, 10-3, . . . , 10-n, respectively.

The common signal line 11 is connected to the terminals of the read switches 10-1, 10-2, 10-3, . . . , 10-n, respectively, and read to a terminal SIG.

In a timing chart shown in FIG. 8 in accordance with the second embodiment, when a start pulse ΦST is inputted, in ΦSIG (at the time of selecting the path switch F), all of the data flip circuits FF-1, 2, 3, . . . n of the scanning circuit array 1 sequentially transfer data of Q1, 2, 3, . . . n in synchronism with the clock signal ΦCK till the n-th data assuming that the position of the start pulse ΦST is $0^{th}$ data of the clock ΦCK. For that reason, all of the sensor elements 9-1, 9-2, 9-3, . . . , 9-n sequentially output the $0^{th}$ data to the n-th data of the clock ΦCK.

In ΦSIG (at the time of selecting the path switch G), the data flip circuits FF-1, 4, 5, 8, 9, 11, 12, and n of the scanning circuit array 1 sequentially transfer data of Q1, Q4, Q5, Q8, Q9, Q11, Q12, and Qn in synchronism with the clock signal ΦCK till the seventh data assuming that the position of the start pulse ΦST is $0^{th}$ data of the clock ΦCK. For that reason, all of the sensor elements 9-1, 9-4, 9-5, 9-8, 9-9, 9-11, 9-12, and 9-n sequentially output the $0^{th}$ data to the seventh data of the clock ΦCK.

In ΦSIG (at the time of selecting the path switch H), the data flip circuits FF-1, 4, 9, 12, and n of the scanning circuit array 1 sequentially transfer data of Q1, Q4, Q9, Q12, and Qn in synchronism with the clock signal ΦCK till the fifth data assuming that the position of the start pulse ΦST is $0^{th}$ data of the clock ΦCK. For that reason, all of the sensor elements 9-1, 9-4, 9-9, 9-1, and 9-n sequentially output the $0^{th}$ data to the fifth data of the clock ΦCK.

In ΦSIG (at the time of selecting the path switch I), the data flip circuits FF-1, 6, 9, and n of the scanning circuit array 1 sequentially transfer data of Q1, Q6, Q9, and Qn in synchronism with the clock signal ΦCK till the fourth data assuming that the position of the start pulse ΦST is $0^{th}$ data of the clock ΦCK. For that reason, all of the sensor elements 9-1, 9-6, 9-9, and 9-n sequentially output the $0^{th}$ data to the fourth data of the clock ΦCK.

As described above, a large number of scanning circuits that scan only the arbitrary data flip circuit and skip reading of the data can be selected. For that reason, there can be realized the sensor IC which is capable of reading only the output of the arbitrary sensor element. Also, there is provided the sensor IC which is capable of making the reading speed high while the amount of information is suppressed to the minimum.

In this embodiment, for convenience, the sensor IC uses the sensor element, but the sensor element may be formed of the photodiode or photo-transistor of the photoelectric conversion element. As a result, the sensor IC is applicable to a linear image sensor IC or an optical fingerprint sensor which can pick up an arbitrary signal or change over the resolution, or an electrostatic fingerprint sensor which can pick up an arbitrary signal or change over the resolution if an electrostatic capacity is used for the sensor element.

Also, when the sensor element portion is structured by a terminal, if digital data or an analog signal is held in the respective sample/hold circuits from the external once, the sensor IC is applicable to a processing IC that picks up an arbitrary signal.

Figure 9A:
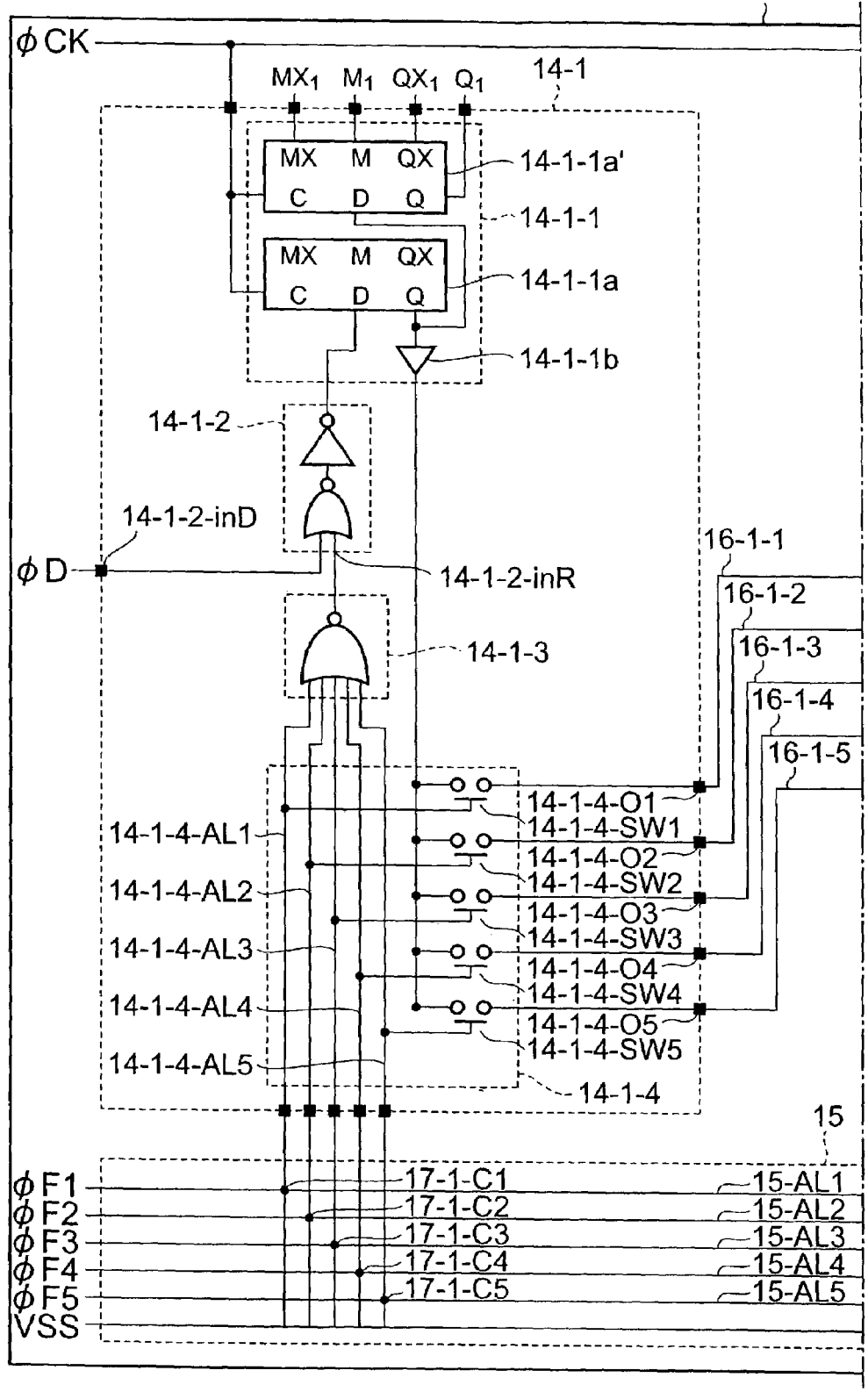
FIGS. 9A-9C (hereinafter "FIG. 9") show a circuit block diagram of a scanning circuit in accordance with a third embodiment of the present invention.
Figure 9B:
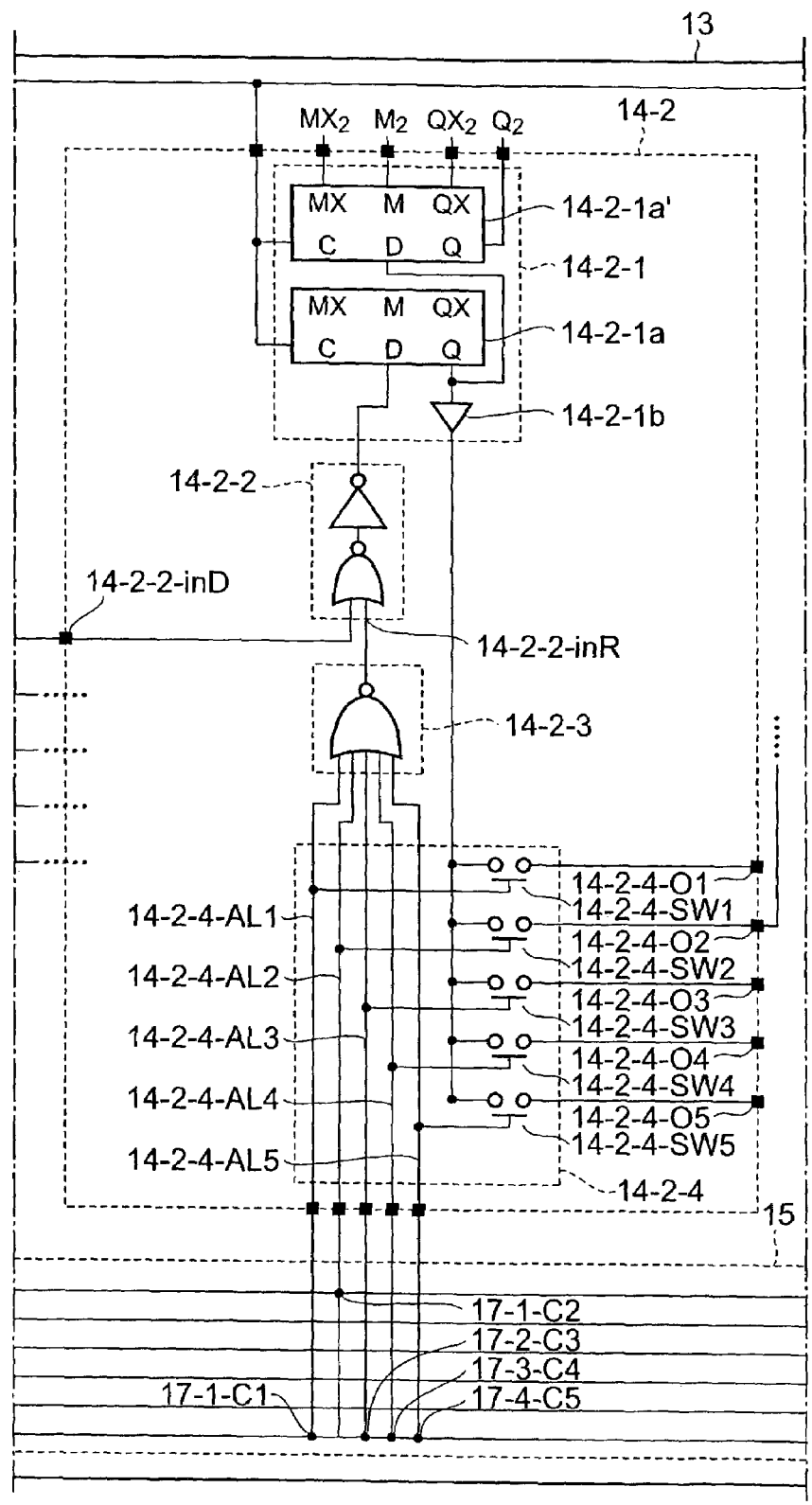
Figure 9C:
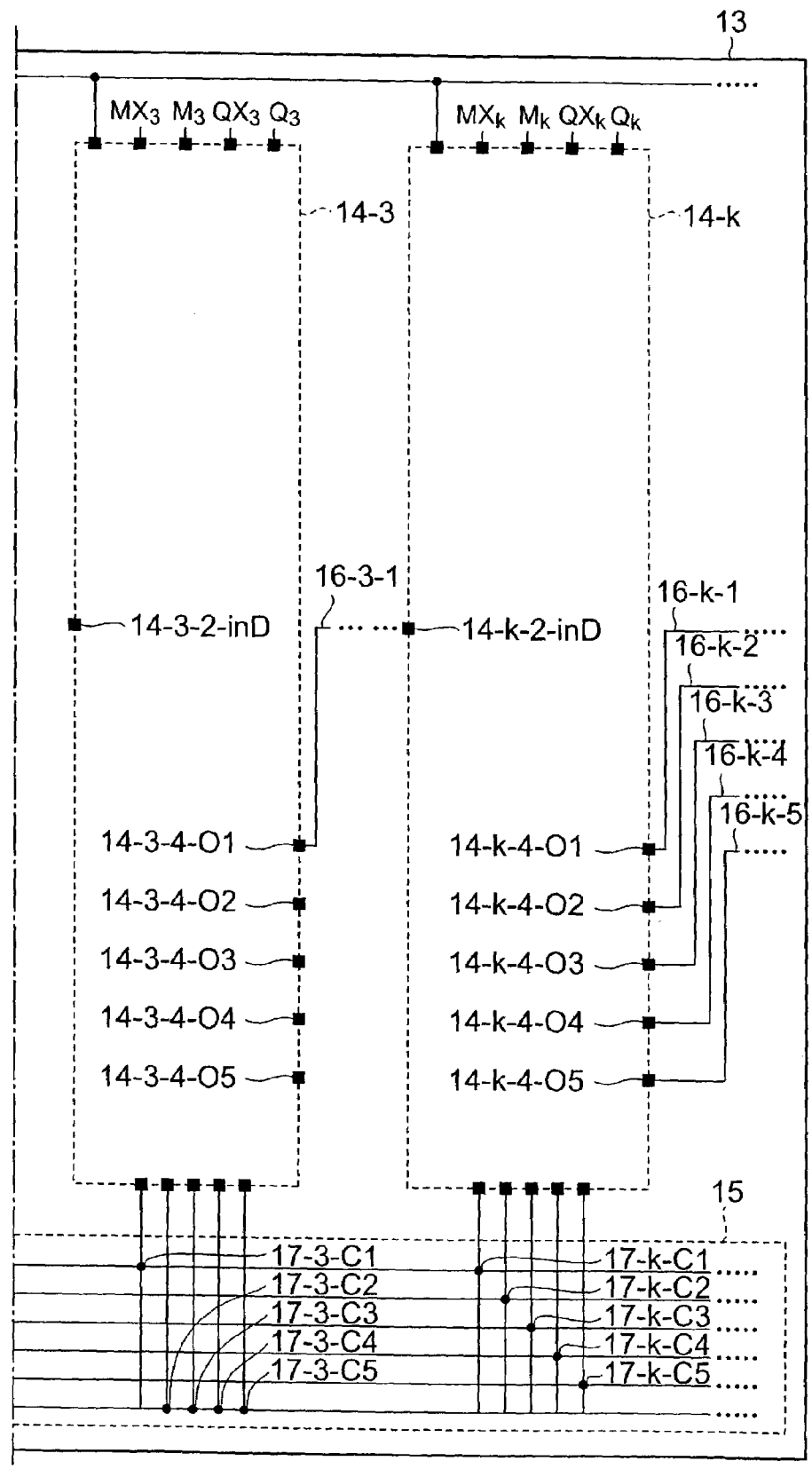

A third embodiment of the present invention will be described with reference to the accompanying drawings. FIGS. 9A to 9C show a circuit block diagram of a scanning circuit in accordance with an embodiment of the present invention. This embodiment shows a circuit structure that realizes the scanning circuit shown in the first embodiment. Hereinafter, a description will be given of this embodiment with reference to FIG. 1 showing the first embodiment and FIG. 9 showing this embodiment.

Referring to FIGS. 9A to 9C, a scanning circuit 13 is made up of scan circuit blocks (hereinafter "scanning circuit blocks") 14-1 to 14-n, a scanning circuit control signal line array 15, data signal lines 16-1 to 16-n-5, and scanning circuit control signal selecting contacts 17-1-C1 to 17-n-C5.

The scanning circuit block 14-1 is made up of a flip flop circuit block 14-1-1, a reset circuit block 14-1-2, a path switch circuit block 14-1-3, and path switch-reset circuit control signal lines 14-1-AL1 to 14-1-AL5. The scanning circuit blocks 14-2 to 14-n are identical in circuit structure with the scanning circuit block 14-1.

The scanning circuit control signal line array 15 is made up of the scanning circuit control signal lines 15-AL1 to 15-AL5. The scanning circuit control signal lines 15-AL1 to 15-AL4 are inputted with mode changeover signals ΦF to ΦI, respectively, and the scanning circuit control signal line 15-AL5 is given a VSS potential that gives a low-level potential.

The data signal lines 16-1 to 16-n-4 are signal wirings that connect the data signal output terminals 14-1-4-O1 to 14-n-4-O5 of the scanning circuit block to the data signal input terminals 14-2-D to 14-n-D of the scanning circuit block, respectively. The data signal input terminal and the data signal output terminal between the scanning circuit blocks can be arbitrarily connected to each other by using the above-mentioned data signal lines.

The scanning circuit control signal selecting contacts 17-1-C1 to 17-n-C5 are nodes that connect the path switch-reset circuit control signal lines 14-1-AL1 to 14-1-AL5 and the scanning circuit control signal lines 15-AL1 to 15-AL5. The path switch-reset circuit control signal line and the scanning circuit control signal line can be arbitrarily connected to each other by using the scanning circuit control signal selecting contact, and the path switch that is controlled by the mode changeover signals ΦDF to ΦI can be arbitrarily changed.

In this example, the path switches 14-1-4-SW1 to 14-1-4-SW4 shown in FIG. 9 correspond to SW1-1 to SW4-1 shown in FIG. 1, respectively. Also, in the path switches 14-2-4-SW1 to 14-2-4-SW4 of FIG. 9, the path switch 14-2-4-SW1 corresponds to SW1-2 shown in FIG. 1. The path switches 14-2-4-SW2 to 14-2-4-SW4 shown in FIG. 9 are not shown in FIG. 1.

Also, the scanning circuit block 14-1 shown in FIG. 9 has the same function as a circuit structured by FF-1, NOR-1, SW1-1, SW2-1, SW3-1 and SW4-1 shown in FIG. 1. Also, the scanning circuit block 14-2 shown in FIG. 9 has the same function as a circuit that is structured by FF-2, NOR-2 and SW1-2 shown in FIG. 1. Also, the scanning circuit blocks 14-3 to 14-n shown in FIG. 9 have the same function as a circuit that is structured by FF, NOR and SW shown in FIG. 1, respectively. Further, the mode changeover signals ΦF to ΦI shown in FIG. 9 correspond to ΦF to ΦI shown in FIG. 1, respectively.

Subsequently, the circuit structure of the scanning circuit block 14-1 shown in FIG. 9 will be described. The flip flop circuit block 14-1-1 is made up of a data signal read-skipping flip flop circuit 14-1-1a, a data signal synchronization flip flop circuit 14-1-1a' and a data signal amplification buffer 14-1-1b.

The data signal read-skipping flip flop circuit 14-1-1a and the data signal synchronization flip flop circuit 14-1-1a' are inputted with the clock signal ΦCK. The output Q of the data signal read-skipping flip flop circuit 14-1-1a is connected to the terminal D of the data signal synchronization flip flop circuit 14-1-1a' and the input of the data signal amplification buffer 14-1-1b.

The reset circuit block 14-1-2 is made up of a 2 OR circuit and a 4 NOR circuit which are made up of a 2 NOR circuit and a NOT circuit. In the first embodiment, there is provided the 2 NOR circuit as shown by NOR-1 of FIG. 1, but in this embodiment, the input R1 of NOR-1 shown in FIG. 1 is so structured as to have 4 inputs.

The data signal input terminal 14-1-D which is one input of the reset circuit block 14-1-2 is inputted with the start signal ΦST. The other input of the reset circuit block 14-1-2 is connected with the path switch-reset circuit control signal lines 14-1-4-AL1 to 14-1-4-AL5.

One terminals of the path switches 14-1-4-SW1 to 14-1-4-SW5 are connected to the output of the data signal amplification buffer 14-1-1b, and other terminals thereof are connected to the data output terminals 14-1-O1 to 14-1-O5 of the scanning circuit block 14-1, respectively.

Signals from the path switch-reset circuit control signal lines 14-1-AL1 to 14-1-AL5 are inputted to terminals that conduct the on/off control of the path switches 14-1-4-SW1 to 14-1-4-SW5, respectively. In this example, the path switches 14-1-4-SW1 to 14-n-4-SW4 turn on in the case where the potential of the path switch-reset circuit control signal line is high level, and turn off in the case where the potential of the path switch-reset circuit control signal line is low level.

The scanning circuit blocks 14-2 to 14-n are identical in circuit structure with the scanning circuit block 14-1.

Subsequently, the connection of the scanning circuit block and the scanning circuit control signal line will be described below.

The path switch-reset circuit control signal lines 14-1-4-AL1 to 14-1-4-AL5 of the scanning circuit block 14-1 are connected to the scanning circuit control signal lines 15-AL1 to 15-AL5 by the nodes 17-1-C1 to 17-1-C5, respectively. Also, the path switch-reset circuit control signal line 14-2-4-AL1 of the scanning circuit block 14-2 is connected to the scanning circuit control signal line 15-AL1 by the node 17-2-C1, and the path switch-reset circuit control signal lines 14-2-4-AL2 to 14-2-4-AL5 are connected to the VSS wiring 15-AL5 that gives the potential of the low level by the nodes 17-2-C2 to 17-2-C5, respectively.

With the above-mentioned structure, the scanning circuit 13 shown in FIG. 9 operates as follows.

In the path switch circuit block 14-1-3 of the scanning circuit block 14-1, the path switch 14-1-4-SW1 turns on/off by the mode changeover signal ΦF, the path switch 14-1-4-SW2 turns on/off by the mode changeover signal ΦG, the path switch 14-1-4-SW3 turns on/off by the mode changeover signal ΦH, and the path switch 14-1-4-SW4 turns on/off by the mode changeover signal ΦI. In the case where the potential of the mode changeover signal ΦF is high level, and the potentials of the mode changeover signals ΦG to ΦI are low level, since the path switch 14-1-4-SW1 turns on, and the path switches 14-1-4-SW2 to 14-1-4-SW4 turn off, a signal that is outputted from the data signal amplification buffer 14-1-1b is outputted from the data signal output terminal 14-1-4-O1 through the path switch 14-1-4-SW1. In the case where the potential of the mode changeover signal ΦG is high level, and the potentials of the mode changeover signals ΦF and ΦH to ΦI are low level, since the path switch 14-1-4-SW2 turns on, and the path switches 14-1-4-SW1 and 14-1-4-SW3 to 14-1-4-SW4 turn off, a signal that is outputted from the data signal amplification buffer 14-1-1b is outputted from the data signal output terminal 14-1-4-O2 through the path switch 14-1-4-SW2. Similarly, in the case where the potential of the mode changeover signal ΦH is high level, and the potentials of the mode changeover signals ΦF, ΦG and ΦI are low level, or the potential of the mode changeover signal ΦI is high level, and the potentials of the mode changeover signals ΦF to ΦH are low level, a signal that is outputted from the data signal amplification buffer 14-1-1b is outputted from the data signal output terminals 14-1-4-O3 and 14-1-4-O4 through the path switch, respectively. With the above-mentioned structure, the output data terminal of the scanning circuit block 14-1 can be selected in accordance with the mode changeover signals ΦF to ΦI.

The output of the reset circuit block 14-1-2 of the scanning circuit block 14-1 is determined in accordance with a signal of the data signal input terminal 14-1-2-inD, which is one of inputs of the reset circuit block 14-1-2, and the mode changeover signals ΦF to ΦI which are inputted to the 4 NOR circuit that is another input thereof. In the case where any one of the mode changeover signals ΦF to ΦI is high level, because the 4 NOR circuit outputs the low level, the output of the reset circuit block 14-1-2 is determined in accordance with the data signal input terminal 14-1-2-inD, and a data signal that is inputted to the data signal input terminal 14-1-2-inD is inputted to the flip flop circuit block 14-1-1 through the reset circuit block 14-1-2. In the case where all of the mode changeover signals ΦF to ΦI are low level, because the 4 NOR circuit outputs the high level, the output of the reset circuit block 14-1-2 is high level regardless of the data signal that is inputted to the data signal input terminal 14-1-2-inD and thus the flip flop circuit block 14-1-1 is reset. With the above-mentioned structure, the reset circuit block 14-1-2 can select whether the data signal is inputted to the flip flop circuit block 14-1-1, or the flip flop circuit block 14-1-1 is reset, in accordance with the mode changeover signals ΦF to ΦI.

The flip flop circuit block 14-1-1 of the scanning circuit block 14-1 is made up of the two flip flop circuits for data signal read-skipping and data signal synchronization and the data signal amplification buffer as described above. In the first embodiment, the flip flop circuit block is made up of one flip flop circuit as shown by FF-1 in FIG. 1. In this circuit structure, the wiring length of each data signal line changes due to the changeover of the on/off operation of the path switches SW-1 to SW-4, and in the case where a difference occurs in a delay time of the data signal between the respective data signal lines, the outputs M and MX that are in synchronism with the clock signal ΦCK cannot be obtained from the flip flop circuit FF-1. On the contrary, in this embodiment, since the two flip flop circuits for data signal read-skipping and data signal synchronization are employed as described above, the wiring length of each data signal line changes due to the changeover of the on/off operation of the path switches, and even in the case where a difference occurs in a delay time of the data signal between the respective data signal lines, the outputs M and MX that are in synchronism with the clock signal ΦCK can be obtained. Also, in this embodiment, even in the case where the wiring length of each data signal line is longer, the delay time of the data signal to the scanning circuit block continuous to the post-stage is reduced as much as possible, and the circuit can be normally operated.

In this embodiment, the path switches 14-1-4-SW1 to 14-1-4-SW4 have the same function as that of the path switches SW1-1 to SW4-1 in the first embodiment shown in FIG. 1, respectively. Also, the flip flop circuit block 14-1-1 has the same function as that of the flip flop circuit block FF-1 in the first embodiment shown in FIG. 1, and the reset circuit block 14-1-2 has the same function as that of NOR-1 in the first embodiment shown in FIG. 1. Accordingly, the scanning circuit block 14-1 has the same function as that of the circuit which is made up of FF-1, NOR-1, and SW1-1 to SW4-1 in the first embodiment shown in FIG. 1.

Since the scanning circuit block 14-1 is structured as described above, the data signal inputted to the scanning circuit block 14-1 can select the output signal data terminal of the scanning circuit block 14-1 by the mode changeover signals ΦF to ΦI, and can select the scanning circuit block which is subjected to data read-skipping.

Subsequently, the circuit operation of the scanning circuit block 14-2 shown in FIG. 9B will be described. In the path switch circuit block 14-2-3 of the scanning circuit block 14-2, the path switch 14-2-4-SW1 is turned on/off in accordance with the mode changeover signal ΦF. Since the terminals that conduct the on/off control of the path switches 14-2-4-SW2 to 14-2-4-SW4 are connected to the VSS wiring 15-AL5 that gives the potential of low level, the path switches 14-2-4-SW2 to 14-2-4-SW4 are always turned off. In the case where the potential of the mode changeover signal ΦF is high level, since the path switch 14-2-4-SW1 turns on, the signal outputted from the data signal amplification buffer 14-2-1b is outputted from the data signal output terminal 14-2-4-O2 through the path switch 14-2-4-SW1. In the case where the potential of the mode changeover signal ΦF is low level, since the path switch 14-2-4-SW1 becomes off, and the path switches 14-2-4-SW2 to 14-2-4-SW4 are always off not depending on the mode changeover signal, the signal outputted from the data signal amplification buffer 14-2-1b is not outputted. Also, in this situation, since all of the potentials of the path switch-reset circuit control signal lines 14-2-4-AL1 to 14-2-4-AL4 are low level, all of the inputs to the 4 NOR circuit of the reset circuit block 14-2-2 are low level, and the reset circuit block 14-2-2 outputs the high level signal without depending on the signal of the data signal input terminal 14-2-D, and thus, the flip flop circuit block 14-2-1 is reset.

In this example, the path switch 14-2-4-SW1 has the same function as that of the path switch SW1-2 in the first embodiment shown in FIG. 1. Because the path switches 14-2-4-SW2 to 14-2-4-SW4 are always turned off, those path switches are not shown in FIG. 1 showing the first embodiment. Also, the flip flop circuit block 14-2-1 has the same function as that of FF-2 in the first embodiment shown in FIG. 1, and the reset circuit block 14-2-2 has the same function as that of NOR-2 in the first embodiment shown in FIG. 1. Therefore, the scanning circuit block 14-2 has the same function as that of the circuit which is structured by FF-2, NOR-2 and SW2 in the first embodiment shown in FIG. 1.

Since the scanning circuit block 14-2 is structured as described above, the data signal inputted to the scanning circuit block 14-2 can select whether data is outputted from the scanning circuit block 14-2, or not in accordance with the mode changeover signal ΦF so as to select the scanning circuit block that should be subjected to data read-skipping.

Subsequently, the connection between the respective scanning circuit blocks shown in FIG. 9 will be described. The scanning circuit blocks 14-1 and 14-2 are connected to the data signal input terminal 14-2-2-inD of the scanning circuit block 14-2 through the data signal line 16-1-1 from the data signal output terminal 14-1-4-O1 of the scanning circuit block 14-1. Similarly, the data signal output terminals 14-1-4-O2 to 14-1-4-O5 are connected to the data signal input terminals of the arbitrary scanning circuit blocks through the data signal lines 16-1-2 to 16-1-5, respectively. Also, the data signal output terminals of the scanning circuit blocks 14-2 to 14-n are connected to the data signal input terminals of the arbitrary scanning circuit blocks through the data signal lines, respectively. Also, the data signal output terminals continuous to the path switches that are always turned off may not be wired to the data signal lines.

With the above-mentioned structure, the output Q of the data signal read-skipping flip flop circuit 14-1-1a of the scanning circuit block 14-1 is connected to the input terminal 14-2-2-D of the scanning circuit block 14-2 through the data signal amplification buffer 14-1-1b, the path switch 14-1-4-SW1 and the data signal line 16-1-1, inputted to the data signal read-skipping flip flop circuit 14-2-1a through the reset circuit block 14-2-2 so as to transfer the data signal. Also, other data signals can be similarly transferred between the scanning circuit blocks through the data signal lines.

Since the scanning circuit 13 is structured as described above, a plurality of scanning circuit blocks which are identical in circuit structure with each other are arranged, and the path switch-reset circuit control signal lines of the scanning circuit blocks and the scanning circuit control signal line array are arbitrarily connected to each other by using the scanning circuit control signal selecting contacts, thereby being capable of realizing a circuit having the same function as that in FIG. 1 showing the first embodiment.

In this embodiment, for convenience, the reset circuit block 14-1-2 is formed of the circuit which is made up of NOT, 2 NOR and 4 NOR, but other logic circuits that realize the same logic may be used.

Also, in this embodiment, for convenience, the path switch turns on in the case where the potential of the path switch control signal is high level and turns off in the case where the potential thereof is low level. However, a reverse logic, that is, a switch or the like which turns on in the case where the potential of the path switch control signal is low level and becomes off in the case where the potential thereof is high level may be applied.

Also, in this embodiment, for convenience, the path switches are shown merely as switches, but elements that enable on-off operation in accordance with the control signal, for example, PMOS transistors, NMOS transistors, transmission gates or the like may be employed.

Also, in this embodiment, for convenience, active low is applied but active high may be applied.

In this embodiment, for convenience, the start signal ΦST is used as a signal that is inputted to the input 14-1-D of the reset circuit block 14-1-2, but other signals, for example, the data signal ΦD or the like may be used.

In this embodiment, the circuit using two flip flop circuits is employed as the flip flop circuit block, but if, for example, the outputs M and MX which are in synchronism with the clock signal ΦCK are not necessary, one flip flop circuit may be provided. Also, two or more flip flop circuits may be provided.

Also, in this embodiment, for convenience, four path switches are disposed within one scanning circuit block, but a plurality of path switches other than four switches may be disposed therein.

In this embodiment, for convenience, the number of scanning circuit control signal lines are five, but a plurality of scanning circuit control signal lines other than five lines may be provided.

In the actual semiconductor device, nodes that connect the above-mentioned path switch-reset circuit control signal lines and the scanning circuit control signal lines can be changed by a connection layer and a wiring layer, and can be changed by one connection layer or wiring layer at the minimum.

Also, in the actual semiconductor device, the respective scanning circuit blocks can be arbitrarily connected to each other by arbitrarily wiring the data signal lines, and the scanning circuit blocks that should be subjected to data read-skipping can be arbitrarily selected. The above data signal lines can be changed by the connection layer and the wiring layer, and can be changed by one wiring layer or connection layer at the minimum.

In the actual semiconductor device, the scanning circuit block can be designed by one layout cell, and the scanning circuit blocks 14-1 to 14-n can be realized by repeat arrangement of the same cell.

As was described above, according to the present invention, when the coarse system of the scanning means is selected in the same IC, a plurality of data flip flop circuits that do not require the scanning circuits can be arbitrarily skipped in reading. Also, the order of scanning is adaptive to plural kinds of different systems.

When the scanning circuit is applied to the sensor IC, the thin-out read which is capable of reading only arbitrary data or the resolution changeover image sensor IC can be realized.

Also, since the present invention is structured as described above, the present invention has the advantages stated below.

Since the scanning circuit blocks that are made up of the flip flop circuit that transfers the data signal, the path switch that controls the transferred portion of the data signal and the reset circuit block that resets the flip flop circuit are repeatedly arranged, layout operation efficiency is improved.

Further, the connection layer is used as a means for connecting the wiring for controlling the path switch and the signal wiring for performing mode changeover, whereby the setting of the mode changeover in accordance with the external signal can be conducted by only one connection layer at the minimum.

Also, since the flip flop circuits are structured by two stages, the outputs M and MX which are in synchronism with the clock signal can be picked up.

Further, the data signal line that connects between the scanning circuit blocks can be changed by one wiring layer at the minimum, and the block which is subjected to data signal read-skipping can be arbitrarily changed.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A scan circuit having a plurality of scan circuit blocks, each of the scan circuit blocks comprising:

a reset circuit block comprised of a reset circuit for receiving a start signal that starts an operation of the scan circuit and for receiving a mode changeover signal for data read-skipping;

a flip-flop circuit block comprising a first flip-flop circuit for receiving a reset signal from the reset circuit block to reset the first flip-flop circuit in accordance with the mode changeover signal, and for outputting a control signal in accordance with the reset signal and in synchronism with a clock signal; and a second flip-flop circuit for outputting a scan signal in accordance with the control signal from the first flip-flop circuit and in synchronism with a clock signal; and a switch circuit block comprised of a switch circuit for outputting a start signal that starts an operation of post-stage scan circuit blocks of the plurality of scan circuit blocks in accordance with the control signal from the first flip-flop circuit and with the mode changeover signal.

2. A scan circuit according to claim 1; wherein the switch circuit controls a scan signal of the post-stage scan circuit blocks for data read-skipping by the mode changeover signal.

3. A scan circuit according to claim 1; wherein the reset signal output by the reset circuit fixes a potential of a data terminal of the first flip-flop circuit.

4. An image sensor comprising:
a plurality of light receiving units that output an output signal in accordance with an amount of light received by the light receiving units;
a read switch element that reads the output signal output by the light receiving units; and
a scan circuit according to claim 1 that arbitrarily skips the output signal read by the read switch element.

5. An image sensor according to claim 4; wherein in the scan circuit, the switch circuit controls a scan signal of the post-stage scan circuit blocks for data read-skipping by the mode changeover signal.

6. An image sensor according to claim 4; wherein in the scan circuit, the reset signal output by the reset circuit fixes a potential of a data terminal of the first flip-flop circuit.

7. An image sensor comprising:
a plurality of light receiving units that output an output signal in accordance with an amount of light received by the light receiving units;
a sample/hold circuit that temporarily holds the output signal of the light receiving unit;
a read switch element that reads an output signal from the sample/hold circuit; and
a scan circuit according to claim 1 that arbitrarily skips the output signal read by the read switch element.

8. An image sensor according to claim 7; wherein in the scan circuit, the switch circuit controls a scan signal of the post-stage scan circuit blocks for data read-skipping by the mode changeover signal.

9. An image sensor according to claim 7; wherein in the scan circuit, the reset signal output by the reset circuit fixes a potential of a data terminal of the first flip-flop circuit.

10. An image sensor having the scan circuit according to claim 1.

11. A scan circuit having scan circuit blocks for outputting a scan signal, each of the scan circuit blocks comprising:

first means for receiving a start signal that starts an operation of the scan circuit and for receiving a mode changeover signal for data read-skipping;

second means for sequentially transferring data to post-stage scan circuit blocks of the plurality of scan circuit blocks, the second means comprising a first flip-flop circuit for receiving a reset signal from the first means to reset the first flip-flop circuit in accordance with the mode changeover signal, and for outputting a control signal in accordance with the reset signal and in synchronism with a clock signal; and a second flip-flop circuit for outputting a scan signal in accordance with the control signal from the first flip-flop circuit and in synchronism with a clock signal; and third means for outputting a start signal that starts an operation of the post-stage scan circuit blocks in accordance with the control signal from the first flip-flop circuit and with the mode changeover signal.

12. A scan circuit according to claim 11; wherein the third means controls the scan signal of the post-stage scan circuit blocks for data read-skipping by the mode changeover signal.

13. A scan circuit according to claim 11; wherein the reset signal output by the first means fixes a potential of a data terminal of the first flip-flop circuit.

14. An image sensor comprising:
a plurality of light receiving units that output an output signal in accordance with an amount of light received by the light receiving units;
a read switch element that reads the output signal output by the light receiving units; and
a scan circuit according to claim 11 that arbitrarily skips the output signal read by the read switch element.

15. An image sensor according to claim 14; wherein in the scan circuit, the third means controls the scan signal of the post-stage scan circuit blocks for data read-skipping by the mode changeover signal.

16. An image sensor according to claim 14; wherein in the scan circuit, the reset signal output by the first means fixes a potential of a data terminal of the first flip-flop circuit.

17. An image sensor comprising:
a plurality of light receiving units that output an output signal in accordance with an amount of light received by the light receiving units;
a sample/hold circuit that temporarily holds the output signal of the light receiving units;
a read switch element that reads an output signal from the sample/hold circuit; and
a scan circuit according to claim 11 that arbitrarily skips the output signal read by the read switch element.

18. An image sensor according to claim 17; wherein in the scan circuit, the third means controls the scan signal of the post-stage scan circuit blocks for data read-skipping by the mode changeover signal.

19. An image sensor according to claim 17; wherein in the scan circuit, the reset signal output by the first means fixes a potential of a data terminal of the first flip-flop circuit.

20. An image sensor having the scan circuit according to claim 11.

* * * * *